United States Patent
Shibayama et al.

(10) Patent No.: US 7,067,005 B2
(45) Date of Patent: Jun. 27, 2006

(54) SILICON WAFER PRODUCTION PROCESS AND SILICON WAFER

(75) Inventors: Takashi Shibayama, Kishima-gun (JP); Yoshio Murakami, Saitama (JP); Takayuki Shingyoji, Saitama (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 0 days.

(21) Appl. No.: 10/912,051

(22) Filed: Aug. 6, 2004

(65) Prior Publication Data

US 2006/0027159 A1 Feb. 9, 2006

(51) Int. Cl.
*C30B 25/12* (2006.01)
*C30B 25/14* (2006.01)

(52) U.S. Cl. ................... 117/2; 117/3; 117/89
(58) Field of Classification Search .......... 117/2, 117/3, 89

See application file for complete search history.

(56) References Cited

U.S. PATENT DOCUMENTS 6,743,289 B1 * 6/2004 Falster et al. ............... 117/2

FOREIGN PATENT DOCUMENTS

JP 110135514 A 5/1999

* cited by examiner

*Primary Examiner*—Felisa Hiteshew
(74) *Attorney, Agent, or Firm*—Pillsbury Winthrop Shaw Pittman LLP

(57) ABSTRACT

This silicon wafer production process has a step of cutting a silicon wafer from a silicon single crystal ingot in a perfect region which includes a perfect region P free of agglomerates of interstitial-silicon-type point defects and agglomerates of vacancy-type point defects and/or a region R in which there is occurrence of ring-shaped oxidation induced stacking faults, and a step of performing rapid thermal annealing on the silicon wafer in a hydrogen atmosphere, an argon atmosphere or an atmosphere containing a mixed gas thereof.

7 Claims, 5 Drawing Sheets

SILICON WAFER PRODUCTION PROCESS AND SILICON WAFER

BACKGROUND OF THE INVENTION

1. Field of the Invention

The present invention relates to a silicon wafer production process and a silicon wafer.

2. Description of the Related Art

In recent years, ever since grown-in defects were demonstrated to cause deterioration of Gate Oxide Integrity (GOI) in silicon wafers, numerous attempts have been made to decrease these grown-in defects.

In particular, technology for growing near-perfect crystals almost free of defects in which v/G (a ratio of ingot pulling velocity (v) to temperature gradient in the ingot near the interface between the ingot and a melt (G)) is controlled when pulling out the single crystal ingot, has been applied practically to the production process of growing near-perfect silicon single crystals.

Silicon wafers free of crystal defects such as Crystal Originated Particle (COP) defects, void defects such as Flow Pattern Defects (FPDs) or the like, and dislocations and the like are used practically as silicon wafers of near-perfect crystals.

Also, as a wafer processing technology to obtain the silicon wafer having extremely satisfactory GOI by eliminating bulk defects (such as COP defects and FPDs) on the surface, technology has been proposed to heat-treat a silicon wafer in an argon or other inert gas atmosphere or in hydrogen by using an electric furnace.

In addition, in recent years, technology for enhancing oxygen precipitation has been widely proposed to form vacancies in silicon crystals by heat-treating a silicon wafer with rapid heat process to high temperature and rapid cool process. For example, a process has been proposed to increase amounts of oxygen precipitation by treating the silicon wafer with rapid heating and cooling treatment (Rapid Thermal Annealing: RTA) in nitrogen or oxygen.

However, although the aforementioned near-perfect crystal silicon wafer is basically free of COP defects and dislocations, residual crystal defects such as oxidation induced stacking fault nuclei (OSF nuclei) are formed due to slight changes in growth conditions, thereby resulting in the problem of the residual crystal defects causing deterioration of GOI.

Also, residual defects resulting from the wafer processing process have been determined to cause deterioration of GOI.

In the case in which beat-treating a silicon wafer in argon or other inert atmosphere or hydrogen, there is the disadvantage of the effects being limited to the vicinity of the surface. In the case of normally used wafers having COP defects, since the internal COP defects remain even after heat treatment, there is the problem of these residual COP defects having a detrimental effect on device characteristics. In the case in which a silicon wafer is heated at high temperature by using an electric furnace, a stress occurs in wafers, in particular in wafers measuring 300 mm in diameter, a large stress occurs, and also problems of slippage occur, thereby resulting in concerns about detrimental effect on their application.

In the case in which heat-treating a silicon wafer with RTA treatment in nitrogen or oxygen, since it is necessary to remove the nitride film or oxide film formed on the surface by machine work or chemical treatment, it coueld lead to cause deterioration of GOI. Therefore, in Japanese Unexamined Patent Publication No. H11-135514, as a technology that does not involve the formation of a nitride film or a oxide film on the surface and also improves surface characteristics, a process is proposed to heat-treat a silicon wafer with RTA treatment in hydrogen or argon containing hydrogen. In this process, although the problem of GOI deterioration resulting from machine work is resolved, in the case of normally used wafers having COP defects, even in the case of small COP defects in the manner of nitrogen-doped crystals, the COP defects are unable to be eliminated in a short period of time, thereby preventing improvement of GOI deterioration caused by the presence of COP defects in bulk.

SUMMARY OF THE INVENTION

In consideration of the aforementioned problems, an object of the present invention is to provide a silicon wafer production process which can decrease detrimental effects attributable to residual crystal defects grown from defect nucleations such as oxidation induced stacking faults (OSFs that are grown from OSF nuclei) and the like and residual processing-induced defects caused by polishing and other machine work, thereby resulting in obtaining a silicon wafer having superior GOI, and to provide a silicon wafer having superior GOI.

As a result of extensive studies, the inventors of the present invention found that, in a silicon wafer production process, by performing RTA treatment in hydrogen, argon or in an atmosphere containing a mixture thereof on a silicon wafer (silicon wafer free of COP defects and FPDs) that has been cut out from a perfect region (which may contain an R-OSF region (a region in which there is occurrence of ring-shaped oxidation induced stacking faults)) free of vacancy-type point defects and interstitial-type point defects, a silicon wafer can be obtained that exhibits superior improvement of surface characteristics, does not require re-polishing following rapid heating and cooling treatment to enhance oxygen precipitation, and has satisfactory GOI characteristics.

Namely, the silicon wafer production process according to the present invention includes a step of cutting a silicon wafer from a silicon single crystal ingot in a perfect region which includes a perfect region P free of agglomerates of interstitial-silicon-type point defects and agglomerates of vacancy-type point defects and/or a region R in which there is occurrence of ring-shaped oxidation induced stacking faults, and a step of performing rapid thermal annealing on the silicon wafer in a hydrogen atmosphere, an argon atmosphere or an atmosphere containing a mixed gas thereof.

According to this production process, as a result of using a hydrogen atmosphere, an argon atmosphere or an atmosphere containing a mixture thereof for the atmosphere when rapid thermal annealing is carried out, detrimental effects attributable to residual crystal defects grown from defect nucleations such as OSFs and the like and residual processing-induced defects caused by polishing and other machine work can be decreased, thereby making it possible to improve GOI characteristics. Especially even in the silicon wafer cut from the silicon single crystal ingot in the perfect region which includes the region R in which there is occurrence of ring-shaped oxidation induced stacking faults, that is in a perfect region which includes the region in which OSF nuclei exists, OSF nuclei can be reduced by the above-mentioned rapid thermal annealing, thereby making it possible to improve GOI characteristics and make efficient use of the ingot.

In addition, since rapid thermal annealing (RTA) is performed, adequate width of the Denuded Zone (DZ) and uniform intraplanar oxygen precipitates (Bulk Micro Defects: BMDs) can be realized by introducing point defects. As a result, it is possible to produce silicon-wafers having superior gettering characteristics.

This heat treatment differs from other heat treatment in that it does not cause deterioration of the surface state and does not require re-polishing following heat treatment.

Moreover, since this heat treatment can be applied to silicon wafers having a diameter of 300 mm or more for which there is expected to be an increased demand in the future, silicon wafers can be provided that have low levels of slippage.

The temperature of the heat treatment may be from 1135° C. to the melting point of silicon. If the temperature of rapid thermal annealing is below 1135° C., residual crystal defects grown from defect nucleations such as OSFs and the like and residual processing-induced defects caused by polishing and other machine work are not adequately eliminated, thereby possibly preventing expectations of improved GOI characteristics from being adequately realized.

The duration of the heat treatment may exceed 60 seconds. If the duration of rapid thermal annealing is 60 seconds or shorter, residual crystal defects grown from defect nucleations such as OSFs abd the like and residual processing-induced defects caused by polishing and other machine work are not adequately eliminated, thereby possibly preventing expectations of improved GOI characteristics from being adequately realized.

The cooling rate of the rapid thermal annealing may be from 5° C./second to 60° C./second. In this case, oxygen precipitation can be enhanced as a result of freezing point defects (vacancies).

The silicon single crystal ingot may be formed by pulling out the silicon ingot from the silicon melt while adjusting the heating temperature and pulling velocity so that the ratio of the pulling velocity to the temperature gradient is in a range in which the occurrence of agglomerates of interstitial-silicon-type point defects and the occurrence of agglomerates of vacancy-type point defects are prevented and/or oxidation induced stacking fault nuclei are formed.

The oxygen concentration of the silicon wafer according to the present invention is from $1 \times 10^{17}/cm^3$ to $1.2 \times 10^{18}/cm^3$.

Here, the reasons for limiting the oxygen concentration of the silicon wafer to $1 \times 10^{17}/cm^3$ to $1.2 \times 10^{18}/cm^3$ are that the lower limit of oxygen concentration of silicon wafers obtained by the CZ method is $1 \times 10^{17}/cm^3$, and if the oxygen concentration exceeds $1.2 \times 10^{18} cm^3$, precipitation becomes excessive which is unsuitable for wafers.

According to this silicon wafer, since the oxygen concentration is made to be from $1 \times 10^{17}/cm^3$ to $1.2 \times 10^{18}/cm^3$, there is no dislocation and so forth on the surface resulting in superior crystallinity.

Thus, in the case of incorporating a device in this silicon wafer, the characteristics and reliability of the device are improved and as a result, product yield can be increased and product costs can be reduced.

DETAILED DESCRIPTION OF THE PREFERRED EMBODIMENTS

Figure 1:
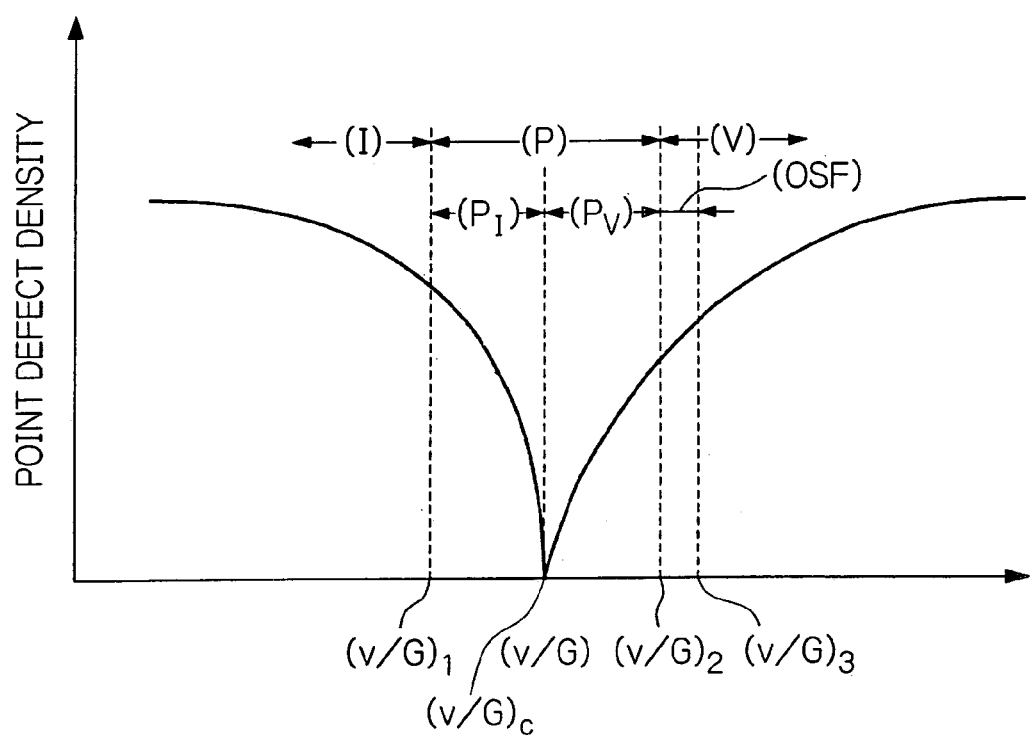
FIG. 1 is an explanatory drawing for explaining the Voronkov theory applied in an embodiment of the silicon wafer production process according to the present invention.

As follows is a description of an embodiment of the silicon wafer production process and silicon wafer according to the present invention, with reference to the drawings.

When in a silicon single crystal ingot, the region where interstitial-silicon-type point defects are predominately present is designated as region I, the region where vacancy-type point defects are predominately present is designated as region V, the perfect region where there are no agglomerates of interstitial-silicon-type point defects nor agglomerates of vacancy-type point defects is designated as perfect region P, and the region where ring-shaped oxidation induced stacking faults (R-OSF) occur is designated as region R, the embodiment of the silicon wafer production process includes a step of cutting out a silicon wafer from a silicon single crystal ingot in a perfect region which includes a perfect region P and/or a region R in which there is occurrence of R-OSF, and a step of performing rapid thermal annealing on the silicon wafer in a hydrogen atmosphere, an argon atmosphere or an atmosphere containing a mixed gas thereof.

The aforementioned silicon wafer is produced by pulling out a silicon single crystal ingot from a silicon melt inside a hot zone furnace according to the Czochralski-grown method (CZ method) using a predetermined pulling velocity profile based on Voronkov theory, followed by slicing the ingot.

In general, when pulling out a silicon single crystal ingot from a silicon melt inside a hot zone furnace according to the CZ method, point defects and agglomerates of point defects (three-dimensional defects) occur as defects present in the silicon single crystal.

These point defects have two typical forms consisting of vacancy-type point defects and interstitial-silicon-type point defects Vacancy-type point defects occur as a result of silicon atoms being released from one of the normal sites of the silicon crystal lattice, resulting in the formation of vacancies within the silicon crystal lattice, with these vacancies becoming point defects. Interstitial-silicon-type point defects are point defects that occur as a result of silicon atoms entering a site other than a lattice point of the silicon crystal (interstitial site).

Point defects are typically formed at the contact surface between the silicon melt (molten silicon) and the silicon single crystal ingot (solid silicon). In the case of pulling out an ingot according to the CZ method, as a result of continuously pulling out the ingot, the section that had been the contact surface begins to cool as the ingot is pulled out During cooling, vacancy-type point defects or interstitialsilicon-type point defects are diffused and make contacts with each other, thereby resulting in the formation of agglomerates of vacancy-type point defects or agglomerates of interstitial-silicon-type point defects. In other words, agglomerates are three-dimensional structures that occur due to the contacts of point defects.

In addition to the aforementioned Crystal Originated Particle (COP) defects, agglomerates of vacancy-type point defects include defects referred to as Laser Scattering Tomography Defects (LSTDs) or Flow Pattern Defects (FPDs), while interstitial-silicon-type point defects include defects referred to as interstitial-type large dislocation (LD).

Here, LSTD refers to a defect that has a different refractive index from that of silicon and generates scattered light when silicon single crystal is irradiated with infrared rays. In addition, FPD refers to a defect that becomes a remnant that exhibits a peculiar flow pattern which appears when a silicon wafer obtained by slicing an ingot is Secco etched for 30 minutes (etching using a mixture of HF and $K_2Cr_2O_7$ (0.15 mol/l) at a ratio of 2:1).

Besides vacancy-type point defects and interstitial-silicon-type point defects, OSFs and so forth are formed. Above-mentioned region R in which there is occurrence of ring-shaped OSFs (R-OSFs) is a region in which OSF nuclei exist and the OSF nuclei are distributed in a ring shaped pattern in the cross section of the ingot.

Voronkov theory involves the influence of the ingot pulling velocity (v (mm/min)) and the temperature gradient in the ingot near the interface between the ingot and silicon melt (G(° C./mm)) on formation of defects in silicon. By controlling v/G ($mm^2/min° C.$) based on Voronkov theory, it enables to grow high-purity ingots having low levels of defects. FIG. 1 is an explanatory drawing for explaining the Voronkov theory. In this theory, when v/G is plotted on the horizontal axis and vacancy-type point defect density and interstitial-silicon-type point defect density are plotted on the same vertical axis as shown in FIG. 1, and the relationship between v/G and point defect density is represented in this graph, the boundary between the range of v/G in which the vacancy-type point defects are predominately formed and the range of v/G in which the interstitial-silicon-type point defects are predominately formed can be determined by v/G.

More specifically, when v/G is the critical point $((v/G)_c)$ or greater, an ingot grows in which vacancy-type point defects are predominately present, while when v/G is the critical point $((v/G)_c)$ or less, an ingot grows in which interstitial-silicon-type point defects are predominately present.

In FIG. 1, (I) represents the range of v/G (v/G is $(v/G)_1$ or less) in which the region in which interstitial-silicon-type point defects are predominately present and agglomerates of interstitial-silicon-type point defects are present can be formed, (V) represents the range of v/G (v/G is $(v/G)_2$ or greater) in which the region in which vacancy-type point defects are predominately present and agglomerates of vacancy-type point defects are present can be formed, and (P) represents the range of v/G (v/G is from $(v/G)_1$ to $(v/G)_2$) in which a perfect region in which neither agglomerates of vacancy-type point defects nor agglomerates of interstitial-silicon-type point defects is present can be formed.

In the range (V), the range (OSF) in which OSF nuclei are formed exists adjacent to the range (P) (v/G is from $(v/G)_2$ to $(v/G)_3$) in which the perfect region can be formed.

The range (P) in which the perfect region can be formed is further divided into range $(P_I)$ and range $(P_V)$. Range $(P_I)$ is the range in which v/G is from the aforementioned $(v/G)_1$ to the critical point $((v/G)_c)$, while range $(P_V)$ is the range in which v/G is from the critical point $((v/G)_c)$ to the aforementioned $(v/G)_2$.

Namely, range $(P_I)$ is the range adjacent to range (I) in which an interstitial-silicon-type point defect density is less than the minimum interstitial-silicon-type point defect density capable of forming interstitial-type dislocation, while range $(P_V)$ is the range adjacent to range (V) in which a vacancy-type point defect density is less than the minimum vacancy-type point defect density capable of forming OSF nuclei.

In the present embodiment, when the ingot is pulled out from a silicon melt inside a hot zone furnace, the ingot pulling velocity profile is set so that the ratio of pulling velocity to temperature gradient (v/G) is maintained within the range from a first critical ratio $((v/G)_1)$ to a second critical ratio $((v/G)_2)$. Moreover, the range of v/G may also include $(v/G)_2$ to $(v/G)_3$, that is an OSF nuclei formation range (OSF).

The first critical ratio $((v/G)_1)$ is a critical ratio relating to an occurrence of agglomerates of interstitial-silicon-type point defects, and in the case in which the ingot pulling velocity profile is set so that the ratio of pulling velocity to temperature gradient (v/G) is maintained at equal to or greater than the first critical ratio $((v/G)_1)$, the occurrence of agglomerates of interstitial-silicon-type point defects is prevented.

The second critical ratio $((v/G)_2)$ is a critical ratio relating to an occurrence of agglomerates of vacancy-type point defects, and in the case in which the ingot pulling velocity profile is set so that the ratio of pulling velocity to temperature gradient (v/G) is maintained at equal to or less than the second critical ratio $((v/G)_2)$, the occurrence of agglomerates of vacancy-type point defects is prevented.

The third critical ratio $((v/G)_3)$ is an upper critical ratio of the range in which OSF nuclei are formed, and in the case in which the ingot pulling velocity profile is set so that the ratio of pulling velocity to temperature gradient (v/G) is maintained in the range from $(v/G)_2$ to $(v/G)_3$, OSF nuclei are formed and they are distributed in a ring pattern in the cross-section of the ingot, resulting in a formation of the region R in which there is occurrence of ring-shaped OSFs (R-OSFs). Also in the case in which the ingot pulling velocity profile is set so that the ratio of pulling velocity to temperature gradient (v/G) is maintained at equal to or less than the third critical ratio $((v/G)_3)$, agglomerates of vacancy-type point defects are restricted to within a region where vacancy-type point defects are dominant in the center of the ingot.

This pulling velocity profile is determined by using a distribution of a point defect density in an ingot calculated by running a simulation on the basis of the aforementioned Voronkov theory. In detail, at first, a distribution of a point defect density in a longitudinal section of an ingot produced as continuously altering v/G is calculated by running a simulation. From the calculated distribution of the point defect density in a longitudinal section of the ingot, the range of v/G from $(v/G)_1$ to $(v/G)_3$ which includes the range in which the occurrence of agglomerates of interstitial-silicon-type point defects and the occurrence of agglomerates of vacancy-type point defects are prevented and the range in which OSF nuclei are formed is determined. Furthermore, from the calculated distribution of the point defect density in a cross section of the ingot, producing conditions such as the pulling velocity (v) at which a temperature distribution in a cross section of the ingot is homogeneous are determined.

Next, a reference ingot is produced by continuously altering v/G when the reference ingot is pulled out, and a distribution of a point defect density in the obtained reference ingot is measured. As comparing the calculated distribution of the point defect with the measured distribution of the point defect in the reference ingot, the more accurate range from $(v/G)_1$ to $(v/G)_3$ and producing conditions at which the temperature distribution in a cross section of the ingot is more homogeneous are determined. By repeating these actions, the range from $(v/G)_1$ to $(v/G)_3$ in which the perfect region P and the region R in which there is occurrence of R-OSFs are only formed in the ingot and producing conditions such as the pulling velocity (v) at which the temperature distribution in a cross section of the ingot is homogeneous are determined.

An actual pulling velocity profile is dependent on numerous variables, including but not limited to the desired ingot diameter, the specific hot zone furnace used and the quality of the silicon melt.

Figure 2:
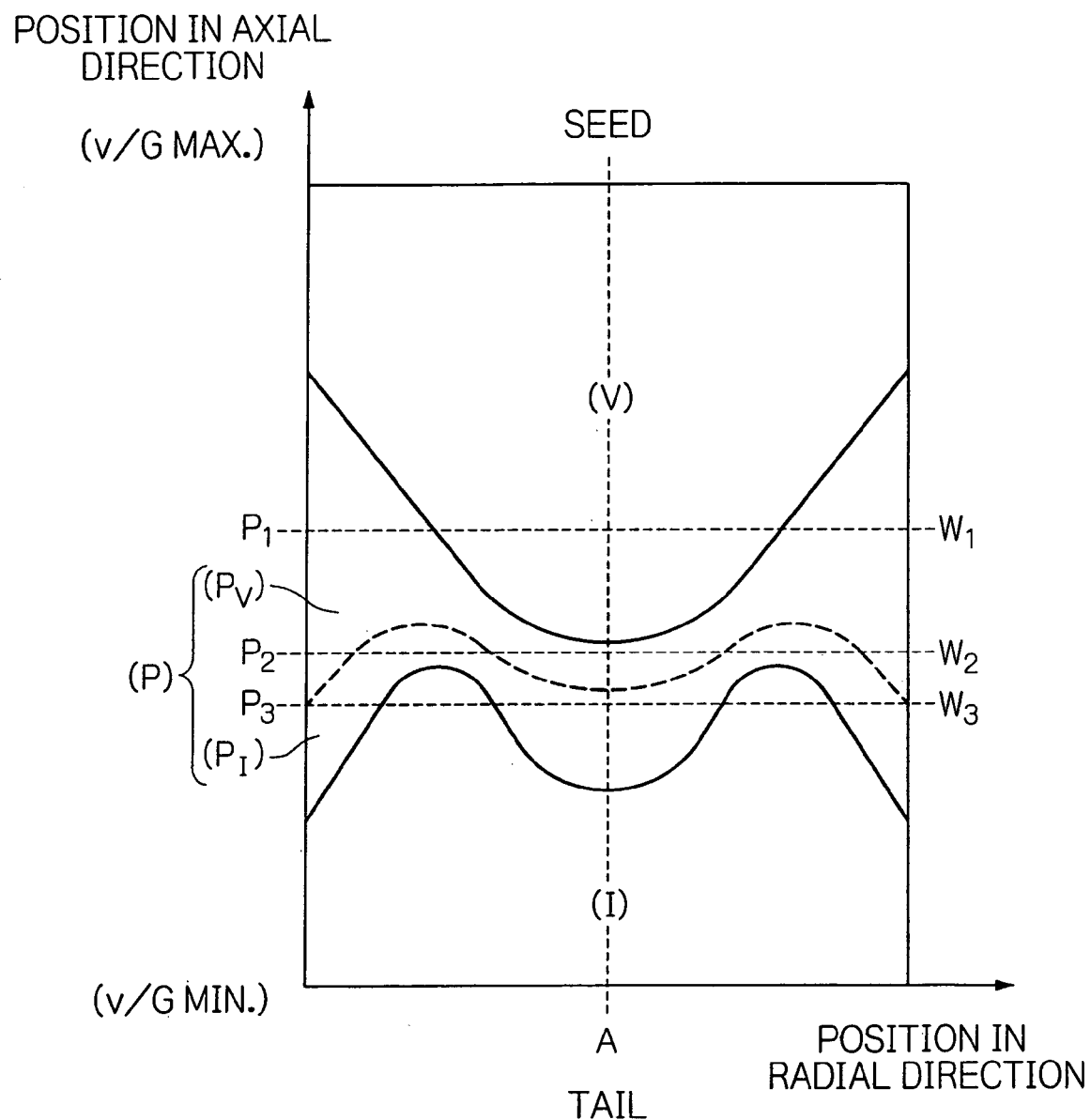
FIG. 2 is a schematic drawing showing a longitudinal section of an ingot used in an embodiment of the silicon wafer production process according to the present invention.

FIG. 2 is a schematic drawing showing a longitudinal section of an ingot in the case of continuously lowering v/G by gradually reducing pulling velocity. In this drawing, in the ingot the region in which vacancy-type point defects are predominately present is indicated by a (V), the region in which interstitial-silicon-type point defects are predominately present is indicated by an (I), and the perfect region in which neither vacancy agglomerates nor interstitial agglomerates are present is indicated by a (P).

The perfect region (P) is further divided into region $(P_I)$ and region $(P_V)$. Here, region $(P_V)$ is the region in which vacancy-type point defects are present that do not form agglomerates in the perfect region (P), while region $(P_I)$ is the region where interstitial-silicon-type point defects that do not form agglomerates are present in the perfect region (P).

As shown in FIG. 2, the position of the ingot in the axial direction $P_I$ contains a region in which vacancy-type point defects are predominately present in the center. Position $P_3$ contains a region in which interstitial-silicon-type point defects are predominately present and a perfect region in the center. Position $P_2$ is a completely perfect region that is free of vacancy agglomerates in the center and interstitial agglomerates at the margin.

As FIG. 2 makes clear, wafer $W_1$ corresponding to position $P_1$ contains a region (V) in which vacancy-type point defects are predominately present in the center. Wafer $W_3$ corresponding to position $P_3$ contains a ring-shaped region (I) in which interstitial-silicon-type point defects are predominately present and a perfect region (P) in the center. Wafer $W_2$ corresponding to position $P_2$ is a completely perfect region (P) that is free of agglomerates of vacancy-type point defects in the center as well as agglomerates of interstitial-type point defects at the margin, and is a mixture of region $(P_V)$ and region $(P_I)$.

The small region that is in the region (V) in which vacancy-type point defects are predominately present and adjacent to the perfect region (P), namely v/G is in the range from $(v/G)_2$ to $(v/G)_3$ in FIG. 1, is a region where there is no occurrence of COP defects nor LDs in the wafer surface.

Figure 3:
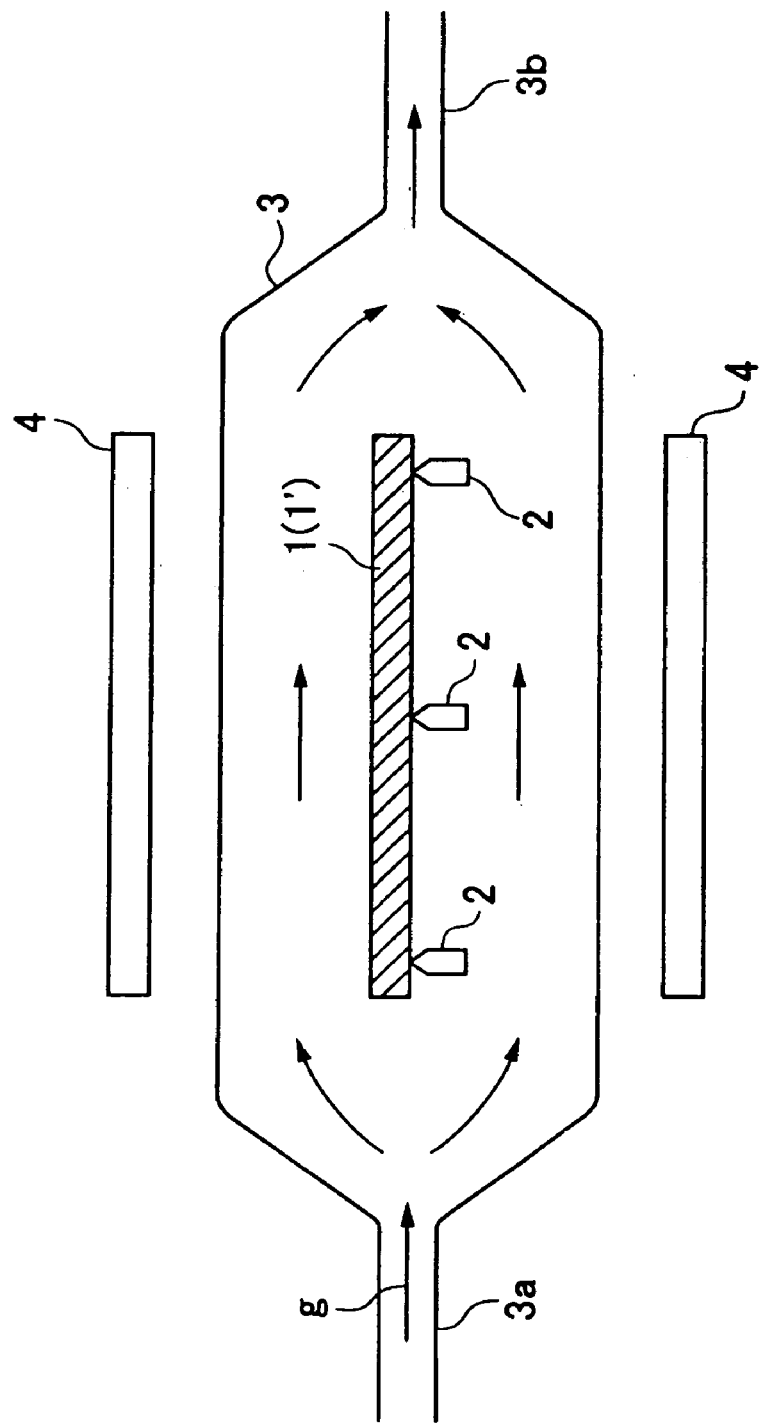
FIG. 3 is a schematic block diagram showing a heat treatment furnace used in an embodiment of a silicon wafer production process according to the present invention.

FIG. 3 shows a heat treat furnace used in an embodiment of the silicon wafer production process according to the present invention. In this drawing, reference symbol 1 indicates a silicon wafer to be subjected to heat treatment, reference symbol 2 indicates pins that support silicon wafer 1, reference symbol 3 indicates a reaction chamber in which pins 2 and silicon wafer 1 placed thereon are housed, and reference symbol 4 indicates infrared lamps provided outside reaction chamber 3 for heating silicon wafer 1.

As has been previously described, silicon wafer 1 is a silicon wafer that has been cut out from a perfect region containing a perfect region P and a region R where R-OSFs occur. The oxygen concentration of this silicon wafer 1 is $1 \times 10^{17}/cm^3$ to $2 \times 10^{18}/cm^3$.

Pins 2 are formed from silicon carbide (SiC) or amorphous carbon (C) and so forth, and three pins 2 are arranged triangularly so as to support the bottom of silicon wafer 1 at three points.

An atmospheric gas supply port 3a for supplying atmospheric gas g to the top and the bottom surfaces of silicon wafers 1, and an atmospheric gas exhaust port 3b for discharging supplied atmospheric gas g, are provided in reaction chamber 3.

A non-oxidizing gas composed of hydrogen ($H_2$), argon (Ar) or a mixed gas thereof is preferable for atmospheric gas g.

In order to perform rapid heat process and rapid cool process (Rapid Thermal Annealing; RTA) on silicon wafer I in an atmosphere of hydrogen ($H_2$), argon (Ar) or mixed gas thereof using this heat treatment furnace, after placing silicon wafer 1 on pins 2, silicon wafer 1 is heated with infrared lamps 4 in the state in which atmospheric gas g has been supplied to reaction chamber 3 from atmospheric gas supply port 3a, thereby performing RTA treatment which includes heating to a temperature of 1135° C. or higher and keeping the temperature for 60 seconds or more, followed by cooling.

As a result of this RTA treatment, residual crystal defects grown from defect nucleations such as OSFs and the like and residual processing-induced defects caused by polishing and other machine work present within silicon wafer 1 are eliminated.

Thus, residual crystal defects grown from defect nucleations such as OSFs and the like and residual processing-induced defects caused by polishing and other machine work are eliminated, and as a result, a silicon wafer 1' is obtained having superior GOI characteristics.

In addition, since this silicon wafer 1' has been heat-treated with RTA, adequate width of the Denuded Zone (DZ) and uniform intraplanar BMDs can be realized by introducing point defects. As a result, it is possible to produce silicon wafers having superior gettering characteristics.

Figure 4:
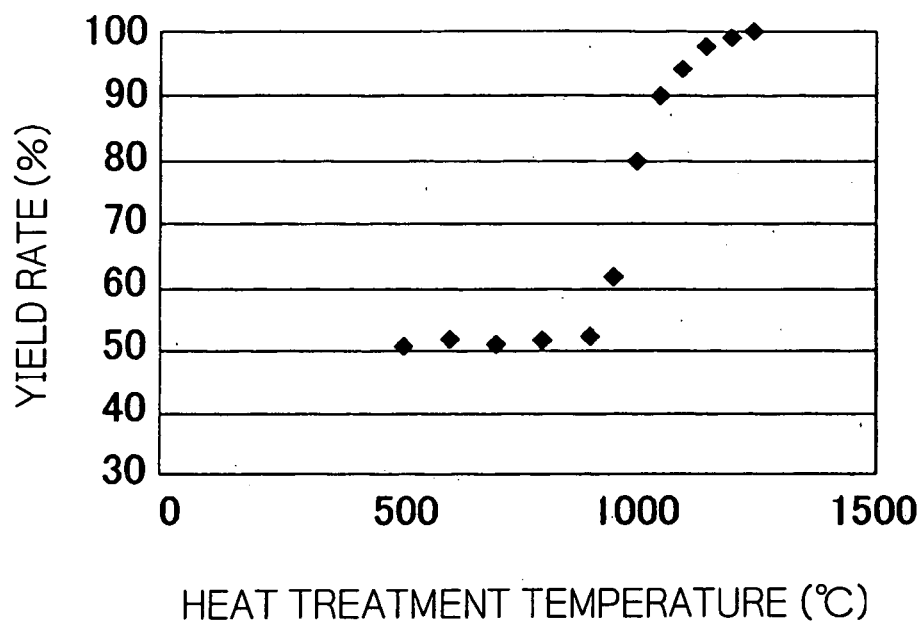
FIG. 4 is a graph showing the RTA treatment temperature dependency of the pressure-resistant oxide film yield rate of MOS (Metal Oxide Semiconductor) capacitors.

FIG. 4 is a graph showing the RTA treatment temperature dependency of the pressure-resistant oxide film yield rate of MOS (Metal Oxide Semiconductor) capacitors. In this graph, the pressure-resistant oxide film yield rate (%) is plotted in the case in which heat-treating silicon wafers for 60 seconds at each heat treatment temperature (° C.).

Here, the pressure-resistant oxide film yield rate is a yield rate of MOS capacitors having satisfactory gate oxide integrity (GOI) which is 8 MV/cm or more is determined based on the test method indicated below.

An oxide film having a film thickness of 9 nm and a polysilicon layer having a film thickness of 0.5 μm were formed on the surface of a silicon wafer followed by patterning and processing to an electrode size of 5 mm×4 mm. The breakdown points after applying a stress current of up to 1 mA are marked in black. The MOS capacitor that has no breakdown points is measured as comforming article having good GOI and the yield rate of it is calculated.

According to FIG. 4, the yield rate begins to improve at a heat treatment temperature of 900° C., yield rate improves rapidly as the heat treatment temperature continues to rise, and the yield rate can be seen to reach better than 90% when the heat treatment temperature reaches 1135° C. or higher.

As a result, it was clearly demonstrated that the temperature of 1135° C. or higher is preferable for the heat treatment temperature.

Figure 5:
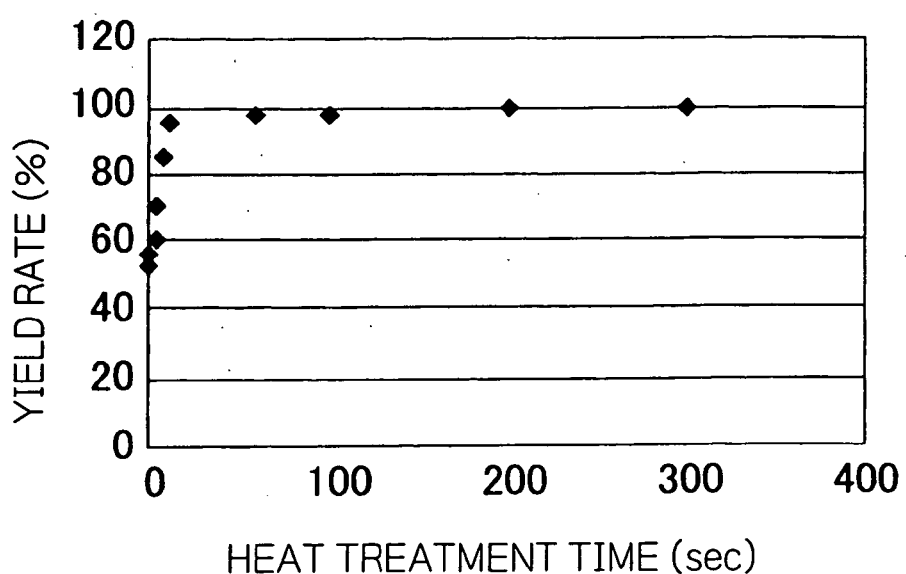
FIG. 5 is a graph showing the RTA treatment time (duration) dependency of the pressure-resistant oxide film yield rate of MOS (Metal Oxide Semiconductor) capacitors.

FIG. 5 is a graph showing the RTA treatment time (duration) dependency of the pressure-resistant oxide film yield rate of MOS (Metal Oxide Semiconductor) capacitors. In this graph, the yield rate (%) is plotted in the case in which heat-treating silicon wafers at 1150° C. for each heat treatment time (sec.)

According to FIG. 5, the yield rate improves rapidly at heat treatment time of 10 seconds, reaches 98% at a heat treatment time of 100 seconds, and when the heat treatment time is 60 seconds or longer, the yield rate can be seen to be 97.8%, which is extremely close to 100%.

As a result, it was clearly demonstrated that a time of 60 seconds or longer is preferable for the duration of heat treatment.

Figure 6:
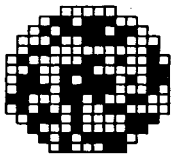
FIG. 6 is a drawing showing the results of evaluating GOI in the case of performing RTA treatment on pure silicon wafers in $H_2$ gas.

FIG. 6 is a drawing showing the results of evaluating GOI in the case of performing RTA treatment on silicon wafers in $H_2$ gas. Here, GOI characteristics are shown in the case of no sacrificial oxidation (A), 10 nm of sacrificial oxidation (B) and 200 nm of sacrificial oxidation (C), respectively, for the absence of RTA treatment (a), RTA treatment at a temperature of 900° C. (b), RTA treatment at a temperature of 1000° C. (c) and RTA treatment at a temperature of 1135° C. (d), respectively. In the drawing, white dots indicate regions of products having satisfactory GOI characteristics (Ebd≧8 MV/cm), while black dots indicate regions of products having defective GOI characteristics (8 MV/cm>Ebd).

According to FIG. 6, as the RTA treatment temperature becomes higher, the regions of products with satisfactory GOI characteristics increase, and in the case in which the RTA treatment temperature is 1135° C., the regions of products with satisfactory GOI characteristics reach 95% or better.

As a result, it is self-evident that silicon wafers having superior GOI characteristics can be obtained in the case in which an RTA treatment temperature is 1135° C. or higher.

According to this silicon wafer production process, since rapid thermal annealing (RTA) treatment is performed in a hydrogen ($H_2$) atmosphere, an argon (Ar) atmosphere or an atmosphere containing a mixed gas thereof on a silicon wafer 1 that has been cut out from a perfect region containing a perfect region P and a region where R-OSF occurs R, residual crystal defects grown from defect nucleations such as oxidation induced stacking faults (OSFs) and the like and residual processing-induced defects caused by polishing and other machine work present within silicon wafer 1 are eliminated, thereby allowing the obtaining of a silicon wafer 1' having superior GOI characteristics.

In addition, adequate width of the Denuded Zone (DZ) and uniform intraplanar BMDs can be realized by introducing point defects, thereby allowing the producing of silicon wafers having superior gettering characteristics.

Also, since there is no deterioration of the surface state, re-polishing following heat treatment is not required.

This silicon wafer is free of residual crystal defects grown from defect nucleations such as OSF and the like and residual processing-induced defects caused by polishing and other machine work, and has extremely superior GOI characteristics. More specifically, the oxygen concentration is from $1 \times 10^{17}/cm^3$ to $1.2 \times 10^{18}/cm^3$, there is no dislocation and so forth on the surface, and crystallinity is superior.

Thus, the characteristics and reliability of a device incorporated in this silicon wafer can be improved, and as a result, product yield can be improved.

While preferred embodiments of the present invention have been described and illustrated above, it should be understood that these are exemplary of the invention and are not to be considered as limiting. Additions, omissions, substitutions and other modifications can be made without departing from the spirit or scope of the present invention. Accordingly, the invention is not to be considered as being limited by the foregoing description, and is only limited by the scope of the appended claims.

What is claimed is:

1. A silicon wafer production process comprising:
 a step of cutting out a silicon wafer from a silicon single crystal ingot in a perfect region which comprises a perfect region P free of agglomerates of interstitial-silicon point defects and agglomerates of vacancy point defects and/or a region R in which there is an occurrence of ring-shaped oxidation induced stacking faults; and
 a step of performing a rapid thermal annealing on said silicon wafer in a hydrogen atmosphere, an argon atmosphere, or an atmosphere containing a mixed gas thereof,
 wherein in said rapid thermal annealing, a duration of a heat treatment exceeds 60 seconds.

2. A silicon wafer production process according to claim 1, wherein a temperature of the heat treatment is from 1135° C. to the melting point of silicon.

3. A silicon wafer production process according to claim 1, wherein a cooling rate of the rapid thermal annealing is from 5° C./second to 60° C./second.

4. A silicon wafer production process according to claim 1, wherein the silicon single crystal ingot is formed by pulling out a silicon ingot from a silicon melt while adjusting the heating temperature and pulling velocity so that the ratio of the pulling velocity to the temperature gradient is in a range in which the occurrence of agglomerates of interstitial-silicon point defects and the occurrence of agglomerates of vacancy point defects are prevented and/or oxidation induced stacking fault nuclei are formed.

5. A silicon wafer production process according to claim 1, wherein the duration of the heat treatment is in a range from more than 60 seconds to 300 seconds.

6. A silicon wafer production process according to claim 1, wherein the duration of the heat treatment is in a range from 100 seconds to 300 seconds.

7. A silicon wafer production process according to claim 1, which further comprises a step of subjecting said silicon wafer to a sacrificial oxidation of 10 to 200 nm.

* * * * *